(12) United States Patent
Bergmann

(10) Patent No.: US 10,073,122 B2
(45) Date of Patent: Sep. 11, 2018

(54) MEASURING TRANSDUCER FOR CONVERTING AN ANALOGUE ELECTRICAL INPUT SIGNAL INTO AN ANALOG ELECTRICAL OUTPUT SIGNAL

(71) Applicant: Phoenix Contact GmbH & Co. KG, Blomberg (DE)

(72) Inventor: Florian Bergmann, Hoexter (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 14/900,492

(22) PCT Filed: Jul. 8, 2014

(86) PCT No.: PCT/EP2014/064623
§ 371 (c)(1),
(2) Date: Dec. 21, 2015

(87) PCT Pub. No.: WO2015/004141
PCT Pub. Date: Jan. 15, 2015

(65) Prior Publication Data
US 2016/0187394 A1    Jun. 30, 2016

(30) Foreign Application Priority Data

Jul. 9, 2013   (DE) .......................... 10 2013 107 267

(51) Int. Cl.
*G01R 19/257* (2006.01)
*G01D 3/02* (2006.01)
*G01D 3/08* (2006.01)

(52) U.S. Cl.
CPC ........... *G01R 19/257* (2013.01); *G01D 3/021* (2013.01); *G01D 3/08* (2013.01)

(58) Field of Classification Search
CPC ...... G01R 15/185; G01R 19/03; G01R 19/18; G01R 19/22; G01R 19/25; G01R 19/257; H01L 41/044; H02M 2001/007
(Continued)

(56) References Cited

U.S. PATENT DOCUMENTS 4,575,806 A * 3/1986 Aldrich ................. G01K 1/026
324/105
4,661,861 A * 4/1987 Rutherford .............. H04N 1/04
358/300

(Continued)

FOREIGN PATENT DOCUMENTS

DE        DD124675 A1    3/1977
EP         0097479 A2    1/1984

(Continued)

OTHER PUBLICATIONS

Authorized Officer Nora Lindner, "International Preliminary Report on Patentability", issued in counterpart International Patent Application No. PCT/EP2014/064623, dated Jan. 21, 2016, Publisher: PCT, Published in: WO.

(Continued)

*Primary Examiner* — Tung X Nguyen
*Assistant Examiner* — Robert P Alejnikov, Jr.
(74) *Attorney, Agent, or Firm* — Kaplan Breyer Schwarz, LLP

(57) ABSTRACT

A measuring transducer for converting an analog electrical input signal into an analog electrical output signal. The measuring transducer contains a detection apparatus for detecting an analog electrical input signal within a predetermined input measurement range, wherein the input measurement range of the measuring transducer is divided into n adjustable partial input measurement ranges and the output range of the measuring transducer is divided into n adjust- (Continued)

able partial output ranges, where n is greater than 1. Further, an apparatus is provided for recognizing the partial input measurement range in which the detected analog electrical input signal lies. An imaging apparatus maps each partial input measurement range to a separate partial output measurement range of the n partial output measurement ranges. Another apparatus converts the detected analog electrical input signal into the associated analog electrical output signal depending on the recognized partial input measurement range.

6 Claims, 1 Drawing Sheet

(58) Field of Classification Search
USPC .......................................................... 324/120
See application file for complete search history.

(56) References Cited

U.S. PATENT DOCUMENTS

| | | | | |
|---|---|---|---|---|
| 2008/0211703 A1* | 9/2008 | Tsuchi | ................ | G09G 3/3685 |
| | | | | 341/144 |
| 2009/0108833 A1* | 4/2009 | Ziegler | ................ | G01R 15/185 |
| | | | | 324/117 R |
| 2009/0303096 A1* | 12/2009 | Chmelar | ............... | H03M 1/002 |
| | | | | 341/160 |
| 2013/0002234 A1* | 1/2013 | Marten | ............. | G01R 19/2503 |
| | | | | 324/120 |
| 2013/0135606 A1* | 5/2013 | Giacotto | ................. | G01C 3/08 |
| | | | | 356/5.01 |

FOREIGN PATENT DOCUMENTS

| | | |
|---|---|---|
| EP | 2597483 A1 | 5/2013 |
| WO | 8908819 A1 | 9/1989 |
| WO | 9428632 A1 | 12/1994 |

OTHER PUBLICATIONS

"German Office Action"; issued in parent patent application No. 10 2013 107 267.4; dated Mar. 24, 2014.

"International Search Report and Written Opinion of the International Searching Authority"; dated Oct. 28, 2014 in International Application No. PCT/EP2014/064623.

"Office Action" issued in counterpart EP patent application No. 14737237.9, dated Jul. 25, 2017.

* cited by examiner

MEASURING TRANSDUCER FOR CONVERTING AN ANALOGUE ELECTRICAL INPUT SIGNAL INTO AN ANALOG ELECTRICAL OUTPUT SIGNAL

FIELD OF THE INVENTION

The invention relates to a measuring transducer, in particular a current or voltage measuring transducer, which converts an analog electrical input signal into an analog electrical output signal.

BACKGROUND OF THE INVENTION

Measuring transducers are well known and are used in particular in automation, control and engineering applications. For example, measuring transducers can change current signals or voltage signals preferably into standardized current or voltage signals and provide them as input signals to an automation device, such as a programmable logic controller. A current transducer may thus deliver a standardized analog electrical current signal from 0 to 20 mA, while a voltage measuring transducer may deliver a standardized analog voltage output signal from 0 to 10 V. However, measuring transducers are also known which can be switched between a voltage output and a current output independently of the input signal.

The company Phoenix Contact Deutschland GmbH manufactures and distributes current measuring transducers in which an input measuring range, which is smaller than the maximum usable input measuring range of the current measuring transducer, can be adjusted by entering a lower and upper limit. The adjusted input range, which is also called a measuring window, is mapped to the maximum available output range.

A disadvantage of this current measuring transducer is that only measurement values within the adjusted measuring window can be given a high resolution and processed, while all measurement information which is outside the adjusted measuring window is lost.

SUMMARY OF THE INVENTION

The object of the present invention is to develop the aforementioned measuring transducer such that the mentioned disadvantages are avoided.

A central idea of the invention can be seen as providing a measuring transducer which, for example depending on the importance of at least one measurement which is required in a process, converts analog electrical input signals, which are received within the maximum allowable input measurement range, with adjustable, differing resolutions, into analog electrical output signals, which lie within the maximum allowable output range of the measuring transducer.

A measuring transducer for converting an analog electrical input signal into an analog electrical output signal is provided hereafter. The measuring transducer may have a detection apparatus, which is designed to detect an analog electrical input signal within a predetermined input measurement range. The input measurement range of the measuring transducer is divided into n adjustable partial input measurement ranges, while the output range of the measuring transducer is divided into n adjustable partial output measurement ranges, where n is greater than 1. Further, an apparatus may be implemented in the transducer which is designed to recognize the partial input measurement range in which the detected analog electrical input signal lies. In addition, an imaging apparatus may be provided in the measuring transducer which is designed to map each partial input measurement range to a separate partial output measurement range of the n partial output measurement ranges. The measuring transducer may further have an apparatus which is designed to convert the detected analog electrical input signal into the associated analog electrical output signal depending on the recognized partial input measurement range.

The predetermined input measurement range is preferably the maximum input measurement range usable by the measuring transducer.

Depending on the significance or importance of at least one physical quantity to be measured, each partial input measurement range may be mapped in compressed or expanded form to the respective partial output measurement range. "Mapped in compressed form" means that input signals which lie within the respective partial input measurement range are converted into an output signal with a lower resolution than input signals which lie within the partial input measurement range, which are mapped "in expanded form" to the associated partial output range.

The measuring transducer may preferably be formed as a current or voltage measuring transducer, which converts an analog input current into an analog output current or an analog input voltage into an analog output voltage.

A method for converting an analog electrical input signal into an analog electrical output signal is hereafter provided. The method preferably provides that an analog, electrical input signal applied to a measuring transducer is detected within a predetermined input measurement range. The input measurement range of the measuring transducer is divided into n adjustable partial input measurement ranges, while the output range of the converter is divided into n adjustable partial output ranges. Here, n is chosen to be greater than 1. Each partial input measurement range can be mapped to a separate partial output range of the n partial output ranges.

The detected analog electrical input signal may be associated with the partial input measurement range in which the input signal lies. The detected analog electrical input signal is converted into the related analog electrical output signal depending on the partial input measurement range associated with the input signal.

Each partial input measurement range may be defined by entering an upper and lower limit. In a similar manner, each partial output measurement range may be defined by entering an upper and lower limit.

BRIEF DESCRIPTION OF THE DRAWINGS

The invention will be described in further detail below with reference to an exemplary embodiment in connection with drawings.

DETAILED DESCRIPTION

Figure 1:
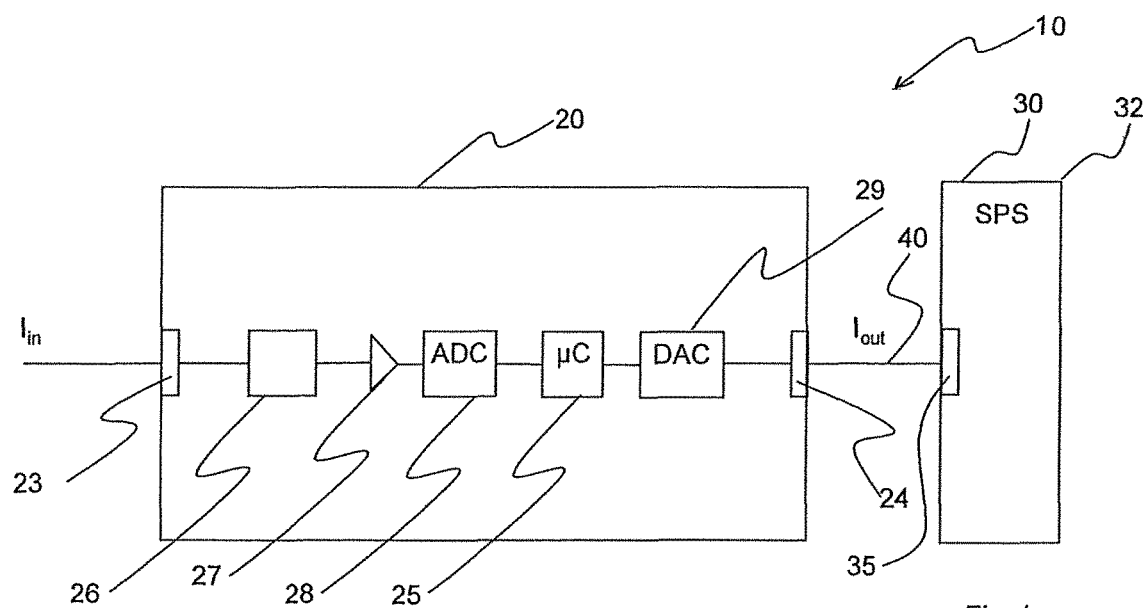
FIG. 1 shows an exemplary current converter according to the invention, which is connected to a programmable logic controller.

FIG. 1 shows a detail of an exemplary automation system 10 with an automation unit 30, which may be formed as a programmable logic controller 32, abbreviated to PLC. The programmable logic controller 32 contains, for example, an analog input interface 35, to which a measuring transducer 20 may be connected, as shown in FIG. 1. Of course, the PLC 32 may have in a known manner a plurality of analog and digital input interfaces as well as analog and digital output interfaces (not shown). The measuring transducer 20 may be a current and/or voltage measuring transducer, for example. Below, a current measuring transducer is considered merely by way of example.

In the explained example, the analog input interface 35 is preferably a standardized analog input interface, which can preferably receive an analog input current of 0 to 20 mA, which, for example, is supplied to the PLC 32 from the measuring transducer 20 via an analog output interface 24 and via a line 40. Instead of an analog input current, an analog input voltage could also be used.

The current measuring transducer 20 may have a detection apparatus 26, which can detect, i.e. measure, an analog input current $I_{IN}$ incoming to an analog input interface 23. The measuring transducer 20 is formed, for example, to process analog input currents between 0 and 55 A. Accordingly, the maximum usable input measurement range of the measuring transducer ranges from 0 to 55 A. The detection apparatus 26 may be connected downstream to an amplifier 27 and an AD converter 28, which converts the analog input current delivered from the amplifier 27 into a digital signal. The digital signal may be supplied to a digital processing unit 25, which may be formed as a microcontroller or programmable microprocessor. The output signal of the processing unit 25 may be passed to a DA converter 29, which supplies an output current $I_{OUT}$ on the output side to the output interface 24. The analog output current $I_{OUT}$ corresponds to the converted analog input current $I_{IN}$.

The processing unit 25 is preferably formed to convert the digital output signal of the AD converter 28, which corresponds to the analog input current $I_{IN}$, into the corresponding analog output current $I_{OUT}$ with the help of the DA converter 29, depending on the size of said analog input current $I_{IN}$, using a mapping rule which can be selected from a plurality of different mapping rules.

Mapping rules are preferably defined in that the maximum input measurement range defined for the current measuring transducer 20, which input measurement range ranges for example from 0 to 55 A, is divided into n adjustable partial input measurement ranges, and the defined output range of the current measuring transducer 20, which ranges for example from 0 to 20 mA, is divided into n adjustable partial output ranges.

Figure 2:
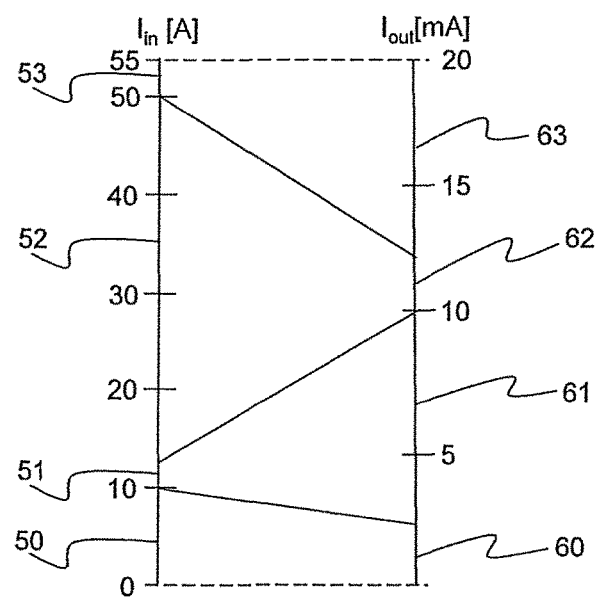
FIG. 2 shows a graphic representation of the mapping rules of the measuring transducer shown in FIG. 1.

As shown merely by way of example in FIG. 2, the input measurement range of the current measuring transducer 20 is divided into four partial input measurement ranges 50 to 53, and the output range into four partial output ranges 60 to 63. For example, the first partial input measurement range 50 detects analog input currents from 0 to 10 A, the second partial input measurement range 51 analog input currents from 10 A to 12 A, the third partial input measurement range 52 analog input currents from 12 A to 50 A, and the fourth partial input measurement range 53 analog input currents from 50 A to 55 A. In a similar manner, the first partial output range 60 detects analog output currents from 0 to 2 mA, the second partial output range 61 analog output currents from 2 mA to 10 mA, the third partial output range 62 analog output currents from 10 mA to 12 mA, and the fourth partial output range 63 analog output currents from 12 mA to 20 mA.

According to this exemplarily selected division, the first partial input measurement range 50 is mapped in compressed form to the first partial output range 60, the second partial input measurement range 51 in expanded form to the second partial output range 61, the third partial input measurement range 52 in compressed form to the third partial output range 62 and the fourth partial input measurement range 53 in expanded form to the fourth partial output range 63, by means of the processing unit 25. This mapping function may be performed by the processing unit 25. In this regard, the processing function 25 performs the function of a mapping apparatus, which is particularly suited in the explained example for mapping each of the four partial input measurement ranges to a separate partial output range of the four partial output ranges. The mapping apparatus is realized primarily as software.

Expanded mapping rules mean that input currents TIN which fall in the second or fourth partial input measurement range are given a higher resolution than input currents TIN which fall in the first or third partial input measurement ranges, which are associated with compressed mapping rules. In other words, due to the exemplarily explained current measuring transducer 20, input currents which fall in the second or fourth partial input measurement ranges may be monitored more accurately by the PLC 32 than input currents which fall in the first or third partial input measurement ranges.

The four mapping rules, which are shown schematically in FIG. 2, may be defined in that, at the measuring transducer 20, the respective upper and lower limits for each partial input measurement region and likewise the respective upper and lower limits for each partial output region can be entered.

The number of partial input measurement ranges and partial output ranges as well as the respective range widths may be set depending on system requirements and/or the importance of physical quantities to be measured, such as motor currents. In every case, there are at least two partial input measurement ranges and two partial output ranges.

The mapping rules shown in FIG. 2 may for example be stored in a memory (not shown) as a lookup table which can be accessed by the processing unit 25. It is also conceivable that the processing unit 25 is programmed such that it can calculate the mapping rules according to the following equations:

1. Mapping rule:

$$0 \leq I_{IN} \leq 10 \text{ A } I_{OUT} = I_{IN} \times 2 \text{ mA}/10 \text{ A}$$

2. Mapping rule:

$$10 \text{ A} \leq I_{IN} \leq 12 \text{ A } I_{OUT} = (I_{IN} - 10 \text{ A}) 8 \text{ mA}/(12 \text{ A} - 10 \text{ A}) + 2 \text{ mA}$$

3. Mapping rule:

$$12 \text{ A} \leq I_{IN} \leq 50 \text{ A } I_{OUT} = (I_{IN} - 12 \text{ A}) 2 \text{ mA}/(50 \text{ A} - 12 \text{ A}) + 10 \text{ mA}$$

4. Mapping rule:

$$50 \text{ A} \leq I_{IN} \leq 55 \text{ A } I_{OUT} = (I_{IN} - 50 \text{ A}) 8 \text{mA}/(55 \text{ A} - 50 \text{ A}) + 12 \text{ mA}$$

The processing unit 25 may also perform the function of an apparatus which is designed to recognize the partial input measurement range in which a detected analog electrical input signal lies. Together with the DA converter 29, the processing unit 25 may assume the function of an apparatus which is designed to convert the detected analog electrical input signal into the associated analog electrical output signal depending on the recognized partial input measurement range, in that the processing unit 25 uses the mapping rule belonging to the recognized partial input measurement range. The output signal of the processing unit 25 is then a digital value, which is converted by the DA converter 29 into the analog electrical output signal IOUT and applied to the output 24 of the measuring transducer 20 for transmission to the PLC 32.

The functionality of the exemplary automation system 10 will be described hereinafter in more detail.

It is assumed that the PLC 32 is to precisely monitor the operation of a safety-related motor (not shown), which for example consumes 11 A.

Due to the exemplarily explained current measuring transducer 20, analog input currents which lie between 10 A and 12 A and thus in the second partial input measurement range 51 may be processed with higher resolution and lower error compared with a conventional current measuring transducer.

It is now further assumed that an analog motor current of 11 A is applied to the analog input interface 23. The motor current is detected or measured by the detection apparatus 26, suitably amplified in the amplifier and converted in the AD converter 28 into a digital signal which corresponds to the analog motor signal. In response to the digital signal, the processing unit 25 recognizes that the analog motor current falls in the second partial input measurement range 51 and thus is to be mapped to the second partial output range 61. Using the corresponding mapping rule, the processing unit 25 produces a digital signal at the output corresponding to an analog output current of 6 mA, which is associated with the input current of 11 A. The digital signal is then converted by the DA converter 29 into the analog output current of 6 mA and transferred to the PLC 32 for further processing.

Assuming that the detection apparatus 26 and the AD converter 28 have an inaccuracy of less than 0.1%, the processing unit 25 and the DA converter 29 an inaccuracy of less than 0.5%, the transmission path 40 an error of 2% and the PLC 32 an input inaccuracy of 1%, then the measurement error with respect to the second partial input measurement range 51 is only approximately 0.2 A compared to a measurement error of approximately 2 A in a conventional current transducer. This means that through the use of the exemplarily explained current measuring transducer 20, the motor stream can be monitored much more exactly than is the case with a conventional current measuring transducer, which does not have divided output ranges.

The measuring transducer 20 may also be operated as a voltage measuring transducer. In this case, the detection apparatus 26 may be formed to measure an analog voltage, while the processing unit 25 may be formed inter alia to convert digital signals which correspond to analog input voltages into associated output voltages together with the DA converter 29 through the use of predetermined mapping rules.

What is claimed is:

1. A measuring transducer for converting an analog electrical input signal into an analog electrical output signal, the measuring transducer comprising:
    an electrical signal detection apparatus for measuring an analog electrical input signal within a predetermined input measurement range, wherein the an input measurement range of the measuring transducer is divided into n adjustable partial input measurement ranges and wherein an a defined output range of the measuring transducer is divided into n adjustable partial output ranges, wherein an upper limit and a lower limit are entered for each partial input measurement range and for each partial output range, thereby defining n mapping rules, where n is greater than 1,
    an amplifier and an AD converter connected in series with the electrical signal detection apparatus,
    a digital processing apparatus connected to the AD converter for:
    detecting which one of the partial input measurement ranges the measured analog electrical input signal lies in, and
    mapping the detected partial input measurement ranges to one of the n partial output ranges in dependence of a respective one of the n mapping rules, and
    a DA converter connected in series to the digital processing apparatus, wherein the digital processing apparatus and the DA converter forming a device for converting the measured analog electrical input signal into an the associated analog electrical output signal depending on the detected partial input measurement range, in that the digital processing apparatus uses the mapping rule belonging to the detected partial input measurement range and delivers a digital output signal corresponding to the measured analog electrical input signal to the DA converter and in that the DA converter converts the digital output signal of the digital processor apparatus into the analog electrical output signal,
    wherein each of the partial input measurement ranges is mapped in condensed or expanded form to the respective partial output range, and
    wherein at least one partial measuring input range is mapped in condensed form to the respective partial output range and at least one partial measuring input range is mapped in expanded form to the respective partial output range.

2. The measuring transducer according to claim 1, wherein the measuring transducer comprises a current or voltage measuring transducer.

3. The measuring transducer according to claim 1, wherein the measuring transducer comprises a current or voltage measuring transducer.

4. The measuring transducer according to claim 1, wherein the mapping rules are stored in a memory as alookup table which can be accessed by the digital processing apparatus.

5. The measuring transducer according to claim 1, wherein the digital processing apparatus is programmed such that it can calculate the mapping rules.

6. The measuring transducer according to claim 1, wherein an analog output interface is connected to the DA converter and capable of being coupled to a standardized analog input interface of an automation unit.

* * * * *